United States Patent
Chuang et al.

(10) Patent No.: US 7,632,729 B2
(45) Date of Patent: Dec. 15, 2009

(54) METHOD FOR SEMICONDUCTOR DEVICE PERFORMANCE ENHANCEMENT

(75) Inventors: Harry Chuang, Austin, TX (US);
Kong-Beng Thei, Hsinchu (TW);
Chung-Long Cheng, Hsinchu (TW);
Sheng-Chen Chung, Hsinchu (TW);
Wen-Huei Guo, Hsinchu (TW);
Jung-Hui Kao, Hsinchu (TW); Ryan Chia-Jen Chen, Chiayi (TW);
Mong-Song Liang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 381 days.

(21) Appl. No.: 11/527,616

(22) Filed: Sep. 27, 2006

(65) Prior Publication Data

US 2008/0076215 A1 Mar. 27, 2008

(51) Int. Cl.
*H01L 21/8238* (2006.01)

(52) U.S. Cl. .............................. 438/199; 257/E21.632; 257/E21.633

(58) Field of Classification Search .. 257/E21.632–633; 438/199
See application file for complete search history.

(56) References Cited

U.S. PATENT DOCUMENTS 3,566,457 A * 3/1971 Engeler ...................... 438/289
4,585,492 A * 4/1986 Weinberg et al. ............ 438/795
5,288,665 A * 2/1994 Nulman ...................... 438/672
5,777,838 A * 7/1998 Tamagawa et al. .......... 361/234
6,180,957 B1 * 1/2001 Miyasaka et al. ............. 257/57
6,906,360 B2 * 6/2005 Chen et al. .................. 257/204
2003/0040158 A1 * 2/2003 Saitoh ........................ 438/279
2004/0104405 A1 * 6/2004 Huang et al. ................ 257/199
2004/0235236 A1 * 11/2004 Hoffmann et al. ........... 438/231
2007/0020838 A1 * 1/2007 Zhu et al. .................... 438/199
2007/0105299 A1 * 5/2007 Fang et al. .................. 438/199

OTHER PUBLICATIONS

Michael Quirk and Julian Serda, Semiconductor Manufacturing Technology, Prentice Hall, pp. 271-273.*

* cited by examiner

*Primary Examiner*—A. Sefer
*Assistant Examiner*—Allen L Parker
(74) *Attorney, Agent, or Firm*—Birch, Stewart, Kolasch & Birch, LLP

(57) ABSTRACT

A method of manufacturing a semiconductor device is disclosed. The method provides a semiconductor substrate with at least a PMOS device and at least an NMOS device thereon. A first insulating layer is formed overlying the NMOS and PMOS devices. A second insulating layer is formed overlying the first insulating layer. The second insulating layer overlying the PMOS device is thinned to leave portion of the second insulating layer. A first thermal treatment is performed on the NMOS and PMOS devices. The second insulating layer overlying the NMOS device and the remaining portion of the second insulating layer overlying the PMOS device are removed and the first insulating layer overlying the NMOS and PMOS devices is thinned to leave a remaining portion thereof.

16 Claims, 9 Drawing Sheets

METHOD FOR SEMICONDUCTOR DEVICE PERFORMANCE ENHANCEMENT

BACKGROUND OF THE INVENTION

1. Field of the Invention

The invention relates to fabrication of a semiconductor device, and more particularly to fabrication of a CMOS device.

2. Description of the Related Art

To enhance NMOS performance without PMOS degradation in a semiconductor device, CMOS and PMOS devices are typically formed with tensile and compressive stresses, respectively. U.S. Pub. No. 2004/0104405 A1 to Huang et al. describes a CMOS device having at least one PMOS device comprising a first stress layer e.g. a compressive stress layer thereon and at least one NMOS comprising a second stress layer e.g. a tensile stress layer thereon, thus the mobility of holes and electrons within the CMOS device is improved. U.S. Pub. No. 2004/0159834 A1 to Huang et al. describes that adoption of a strained silicon layer facilitates fabrication efficiency of devices. U.S. Pub. No. 2006/0014340 A1 to Hisakazu et al. describes a semiconductor device comprising at least one tensile stress film overlying an NMOS formation region and at least one compressive stress film overlying a PMOS formation region.

With continued shrinkage of integrated circuits, down to 65 nm or below, for example, a local stress technique such as the stress memorization technique (SMT) has been presented to enhance device performance. The article entitled, (SMT) by selectively strained-nitride capping for sub-65 nm high-performance strained-Si device application, by Chien-Hao Chen et al., in VLSI Technology, 2004 presents a stress memorization technique for enhancing device performance. PMOS performance, however, is still degraded. Accordingly, a semiconductor device capable of further improving NMOS performance without PMOS deterioration and fabrication methods thereof are desirable.

BRIEF SUMMARY OF THE INVENTION

A detailed description is given in the following embodiments with reference to the accompanying drawings.

Methods for manufacturing semiconductor devices with enhanced performance are provided. An exemplary embodiment of a method for manufacturing a semiconductor device with enhanced performance comprises: providing a semiconductor substrate with at least a PMOS device and at least an NMOS device thereon; forming a conformal first insulating layer overlying the NMOS and PMOS devices; forming a conformal second insulating layer overlying the first insulating layer; thinning the second insulating layer overlying the PMOS device to leave a portion of the second insulating layer, performing a first thermal treatment on the NMOS and PMOS devices; removing the second insulating layer overlying the NMOS device and the remaining portion of the second insulating layer overlying the PMOS device and thinning the first insulating layer overlying the NMOS and PMOS devices to leave a portion of the first insulating layer.

Another embodiment of a method for manufacturing semiconductor devices with enhanced performance comprises: preventing charge accumulation by providing a semiconductor substrate including a front side and a rear side; simultaneously forming a first insulating layer overlying the front side and a second insulating layer overlying the rear side; forming a third insulating layer overlying the first insulating layer; removing the third insulating layer by a wet etching step; and loading the semiconductor substrate onto an e-chuck stage, wherein the second insulating layer is between the e-chuck stage and the semiconductor substrate.

Another embodiment of a method for manufacturing semiconductor devices with enhanced performance comprises: preventing charge accumulation by providing a semiconductor substrate including a front side and a rear side, wherein at least a PMOS device and at least an NMOS device are formed on the front side; simultaneously forming a conformal first insulating layer overlying the NMOS and PMOS devices and a second insulating layer overlying the rear side; forming a conformal third insulating layer overlying the first insulating layer; thinning the third insulating layer overlying the PMOS device to leave a portion of the third insulating layer, performing a first thermal treatment on the NMOS and PMOS devices; removing the third insulating layer overlying the NMOS device and the remaining portion of the third insulating layer overlying the PMOS device and thinning the first insulating layer overlying the NMOS and PMOS devices to leave a portion of the first insulating layer.

Methods of enhancing NMOS performance without degrading PMOS performance in a semiconductor device and problems such as boron penetration to the gate oxide and charge accumulation in the device are desirable.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
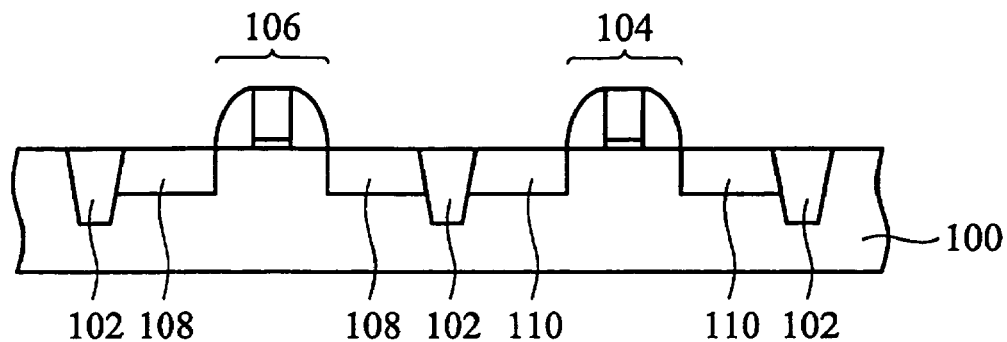
FIG. 1a~1d are sectional views showing a comparative example of fabrication of a CMOS device.

The following description is of the best-contemplated mode of carrying out the invention. This description is made for the purpose of illustrating the general principles of the invention and should not be taken in a limiting sense. The scope of the invention is best determined by reference to the appended claims.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

COMPARATIVE EXAMPLE

An SMT process for NMOS device performance enhancement is adopted into a CMOS fabrication process, i.e. formation of a high-tensile nitride layer. The high-tensile nitride layer serves as a stressor for improving current drivability of an NMOS device. A detailed description is provided in the following.

FIG. 1a~1d are sectional views showing a comparative example of fabrication of a CMOS device.

As shown in FIG. 1a, initially a well/channel implantation for PMOS device 104 and NMOS device 106 (herein, referring to transistors) and isolation steps for both transistor types are performed on a semiconductor substrate 100 in accordance with a CMOS fabrication process. The semiconductor substrate 100 comprises an isolation region 102 for electrically isolating the PMOS device 104 and NMOS device 106. The PMOS device 104 and NMOS device 106 may be fabricated on a P-well region and an N-well region, and may be fabricated directly onto or within the semiconductor substrate 100. The semiconductor substrate 100 may be formed of monocrystalline silicon, silicon germanium (SiGe), strained silicon on SiGe, gallium arsenic, silicon on insulator (SOI), silicon germanium on insulator (SGOI), germanium on insulator (GOI), GaAs, InP or the like. The substrate 100 may further comprise an interfacial layer 11, e.g., a base oxide layer (not shown), to prevent the inter-diffusion of undesired elements between semiconductor substrate 100 and subsequently formed layers. The isolation region 102 may be formed as a shallow trench isolation structure (STI), a LOCOS type isolation structure, or a doped isolation region. In the embodiment of FIG. 1A, the isolation region 102 is an STI structure formed by conventional trench etching and deposition processes well known to those skilled in the art. Also referring to FIG. 1a, the fabrication process continues by forming source/drain extensions (if used) and source/drain regions in the substrate 100 by ion implantation. The formation of these components is well known in the art and thus is not described.

Figure 1B:
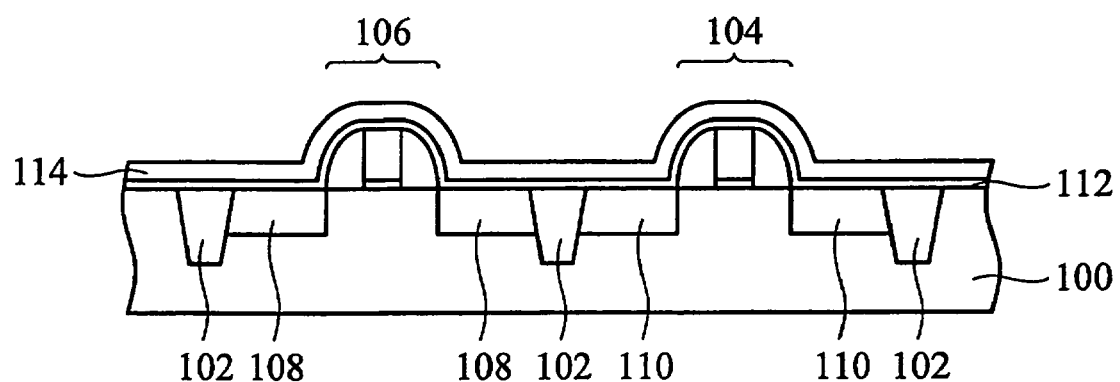
Figure 1C:
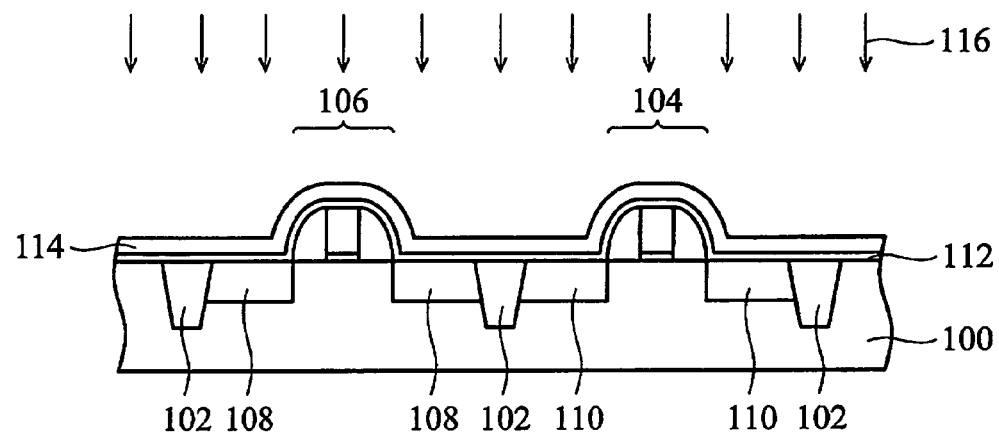

As shown in FIG. 1b, an oxide layer 112 and a silicon nitride layer 114 are conformally deposited on the PMOS device 104, NMOS device 106 and semiconductor substrate 100. A thermal treatment 116, as shown in FIG. 1c, is then performed on the silicon nitride layer, causing a tensile stress therein, thus modulating the channel stress beneath the NMOS device. The oxide layer 112 can be a TEOS oxide layer and formation thereof includes commonly used technologies such as low pressure chemical vapor deposition (LPCVD) or plasma enhanced CVD (PECVD). Methods of forming the silicon nitride layer 114 also include LPCVD or PECVD. The thermal treatment 116 can be rapid thermal annealing (RTA) or spike annealing. As described, the steps shown in FIGS. 1b and 1c are the so-called SMT process by which the NMOS device performance is enhanced. PMOS device performance, however, is degraded due to the same tensile stress from the silicon nitride layer. Additionally, oxide precipitate caused by the thermal treatment 116 is generated on the upper surface of the silicon nitride layer 114, thus affecting subsequent processes i.e. removal of the silicon nitride layer 114 and oxide layer 112.

Figure 1D:
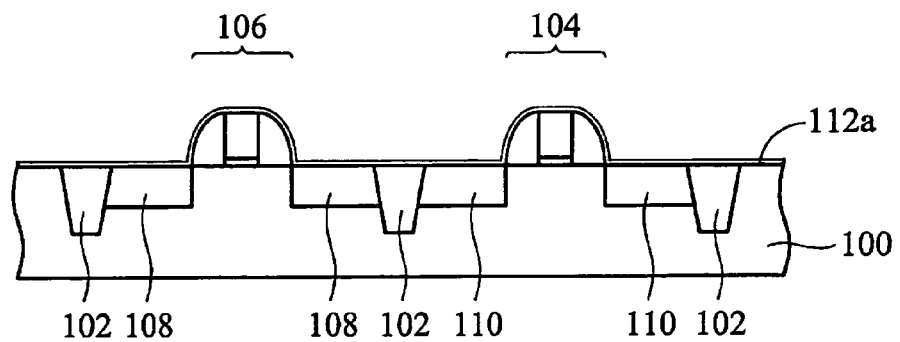

As shown in FIG. 1d, the fabrication process continues by removing the silicon nitride layer 114 and oxide layer 112 in turn. Removal of the silicon nitride layer 114 typically includes wet etching using phosphoric acid. The oxide layer 112 is typically removed by means of HF dilution and a portion 112a thinner than the original oxide layer 112 may remain. Residue of the silicon nitride layer 114 is left because the oxide precipitates on the upper surface thereof worsens the removal effect.

Thereafter, formation of nickel silicide and other subsequent processes proceed, thus a semiconductor device is obtained. The formation of these components is well known in the art and thus is not described.

In this comparative example, NMOS performance is enhanced utilizing a high-tensile nitride layer with a uniform thickness while problems such as PMOS degradation, residue of the silicon nitride layer persist. Specifically, beyond the 90 nm technologies, another, more severe issue, e.g. boron penetration to the gate oxide, may result in the PMOS device when a poly gate of the PMOS device undergoes a so-called pre-dope procedure.

The following embodiments feature adoption of a so-called selective SMT process, referred to as a modified SMT process, immediately following the source and drain (hereinafter, abbreviated to S/D) implantation. Formation of nickel silicide and subsequent processes which are well known then proceed. By doing so, problems such as PMOS device performance degradation, boron penetration to the gate oxide are eliminated.

First Embodiment

FIG. 2a~2i are sectional views showing a first embodiment of fabrication of a CMOS device.

Figure 2A:
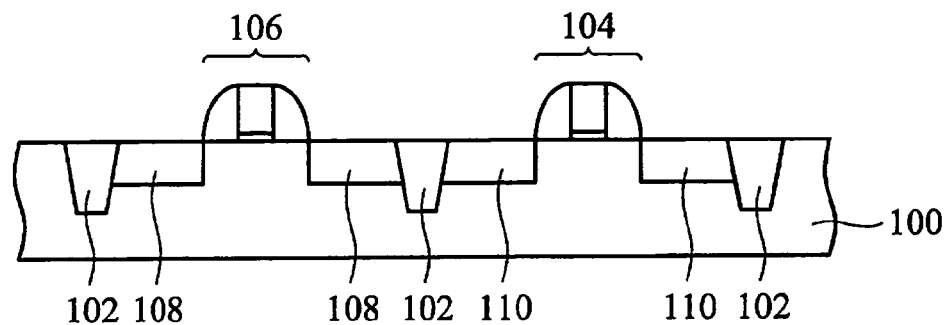
FIG. 2a~2i are sectional views showing an exemplary embodiment of fabrication of a CMOS device.
Figure 2B:
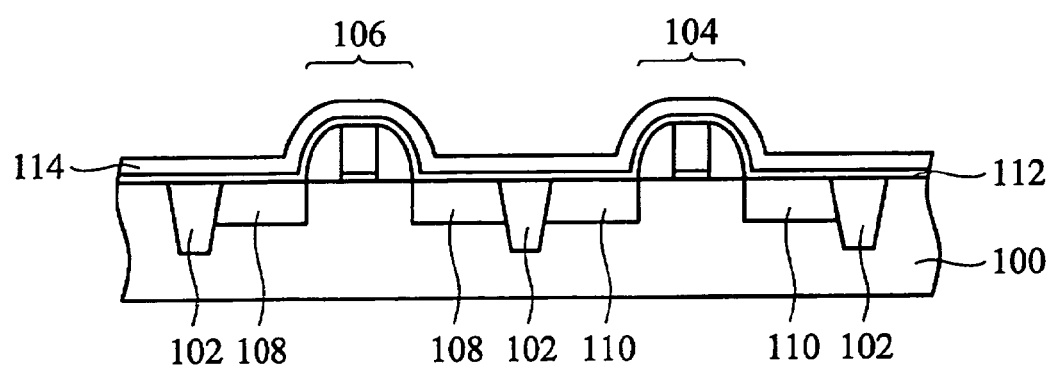
Figure 2C:
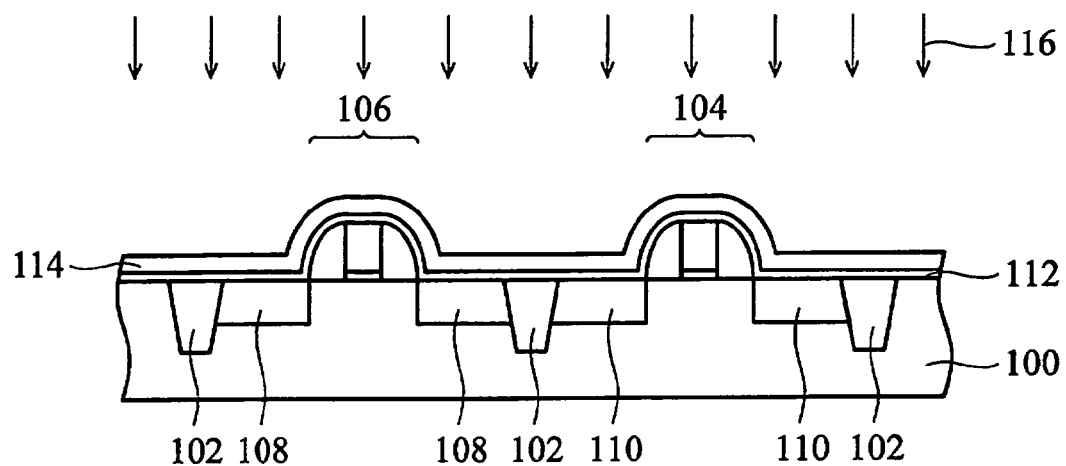

As shown in FIGS. 2a, 2b and 2c, the elements or procedures using the same numerals are similar to (or the same as) those shown in the FIG. 1a~1 and thus are not described again. In the first embodiment, the oxide layer 112 is a TEOS oxide layer of 80 angstroms in thickness and the silicon nitride layer 114 has a thickness greater than 200 angstroms. The oxide layer 112 and the silicon nitride layer 114 are formed at 200~800□. The formation thereof is as described in the comparative example. In other embodiments, the oxide layer 112 has a thickness between 10 and 300 angstroms.

Figure 2D:
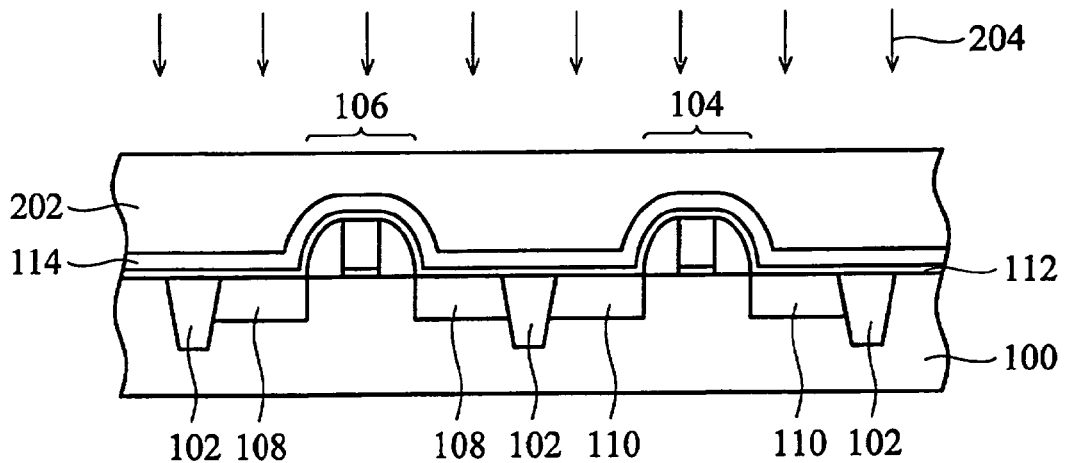

As shown in FIG. 2d, a photoresist layer 202 is subsequently disposed on the PMOS device 104 and NMOS device 106 and the upper surface of the semiconductor substrate 100. An exposure step 204 is then performed on the photoresist layer 202 overlying the overall semiconductor substrate 100 prior to a development step (not shown).

Figure 2E:
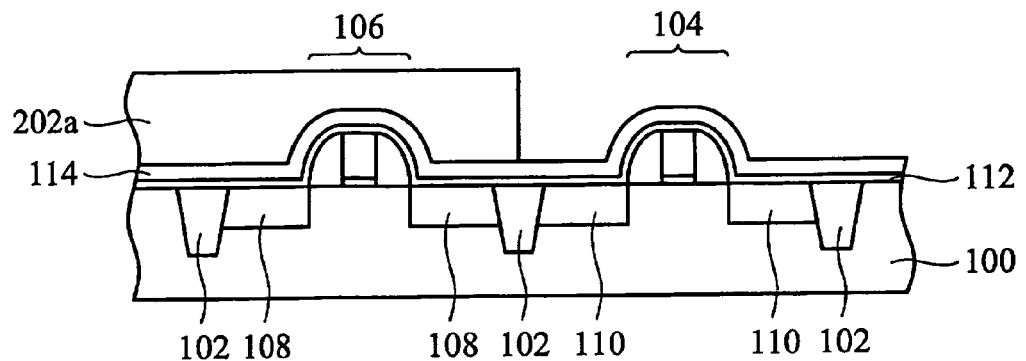

As shown in FIG. 2e, the processing continues to proceed an etching step, thus forming a patterned photoresist layer 202a on the NMOS device 106 and leaving the upper surface of the silicon nitride layer 114 overlying the PMOS device 104 uncovered.

Figure 2F:
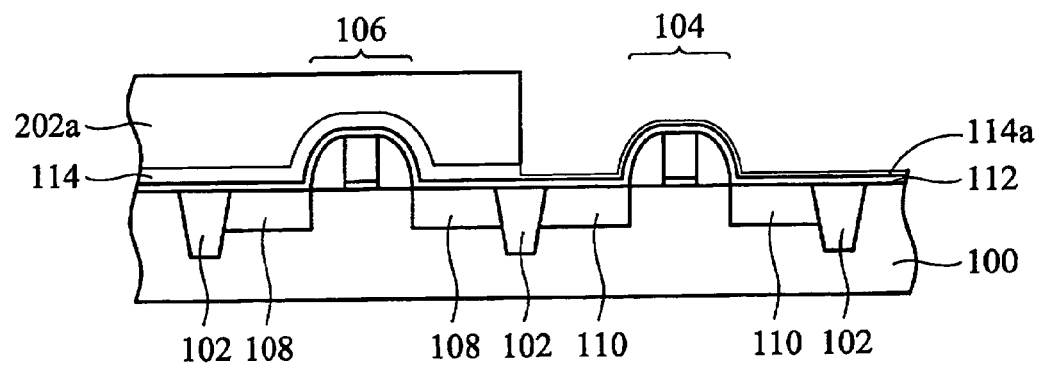

As shown in FIG. 2f, the uncovered silicon nitride layer 114 overlying the PMOS device 104, with patterned photoresist layer 202a serving as an etching mask, is etched to a predetermined thickness capable of eliminating problems such as PMOS device performance degradation, and boron penetration to the gate oxide. In the first embodiment, the remaining portion of the second insulating layer 114a overlying the PMOS device has a thickness of 100 angstroms. In other embodiments, the remaining portion of the second insulating layer 114a overlying the PMOS device has thickness between 10 and 130 angstroms, preferably between 20 and 100 angstroms.

Figure 2G:
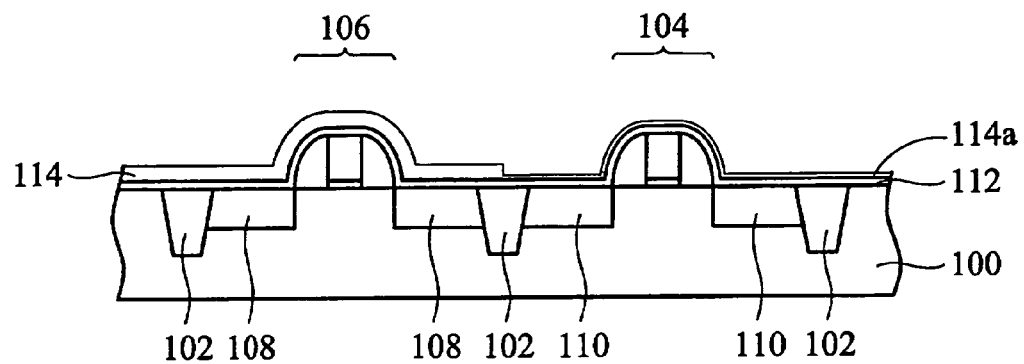

As shown in FIG. 2g, the patterned photoresist layer 202a is then stripped.

Figure 2H:
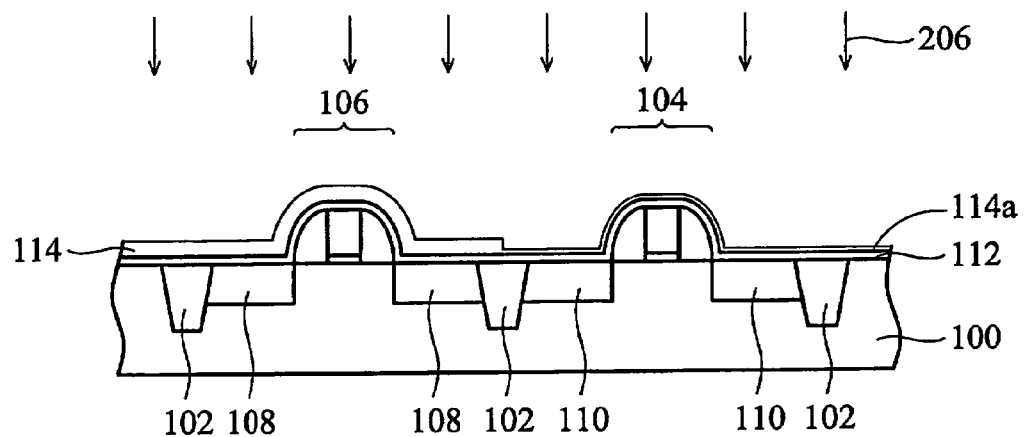

As shown in FIG. 2h, an S/D annealing procedure 206 is performed using an RTA. The S/D annealing procedure 206 also can be spike annealing.

Before full removal of the silicon nitride layer 114 overlying the NMOS device 106 and the remaining portion of the second insulating layer 114a overlying the PMOS device 104 using phosphoric acid, the semiconductor substrate 100 may be submerged in an HF dilution at 10~80□ for a certain duration to remove the oxide precipitate on the silicon nitride layer surface (not shown). This facilitates the subsequent process i.e. removal of the silicon nitride layer.

Figure 2I:
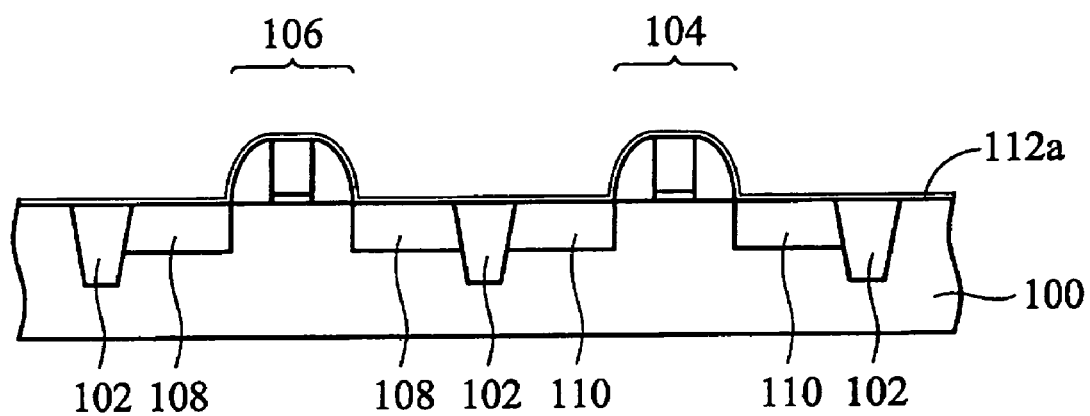

As shown in FIG. 2i, the silicon nitride layer 114 overlying the NMOS device 106 and the remaining portion of the second insulating layer 114a overlying the PMOS device 104 are fully removed using phosphoric acid at 100~2000. The oxide layer 112 is also removed until it has a thickness of about 50 angstroms. In other embodiments, the remaining oxide layer 112 has a thickness between 30 and 60 angstroms.

Thereafter, formation of nickel silicide and other subsequent processes proceed, thus a semiconductor device is obtained. The formation of these components is well known in the art and thus is not described.

Second Embodiment

The second embodiment is similar to the first embodiment, except that a silicon nitride layer 114 of 350 angstroms is employed (referring to FIG. 2a). Specifically, the second embodiment is suitable for 65 nm generation and the thickness of the silicon nitride layer 114 can be between 200-350 angstroms depending on a pitch between the PMOS and NMOS devices.

Third Embodiment

The third embodiment is similar to the first embodiment, except that a silicon nitride layer 114 of 500 angstroms is employed (referring to FIG. 2a). Specifically, the third embodiment is suitable for the 90 nm generation and the thickness of the silicon nitride layer 114 can be between 200~500 angstroms depending on a pitch between the PMOS and NMOS devices.

The following fourth embodiment comprises a method for preventing charge accumulation in a semiconductor device. The charge is generated from an electrostatic chuck (e-chuck) stage of an apparatus and may accumulate within the semiconductor substrate of the described comparative example or embodiments, affecting the reliability of the semiconductor device.

Fourth Embodiment

Figure 3A:
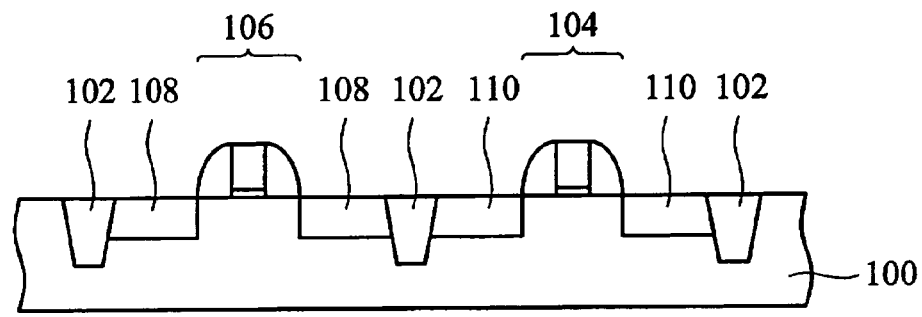
FIG. 3a~3d are sectional views showing an exemplary embodiment of fabrication of a CMOS device.

FIG. 3a shows a semiconductor substrate 100 of FIG. 1a. The formation of the semiconductor substrate 100 is the same as described in the comparative example and thus is not described further.

Figure 3B:
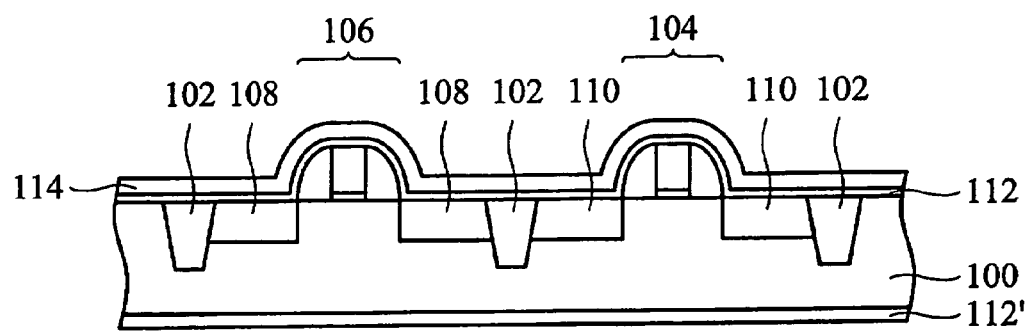

As shown in FIG. 3b, the process is similar to that shown in the FIG. 1b except that the oxide layer 112 and an additional oxide layer 112' on the rear side of the semiconductor substrate 100 are formed simultaneously prior to the formation of the silicon nitride layer 114. The oxide layers 112 and 112' have a thickness between 10 and 300 angstroms. The oxide layer 112 and the silicon nitride layer 114 are formed at a temperature of less than 800☐. The silicon nitride layer 114 is a tensile stress layer having a density of 0.1~5.0 g/cm³, preferably less than 3 g/cm³. In other embodiments, the oxide layer 112 can be a TEOS layer.

Figure 3C:
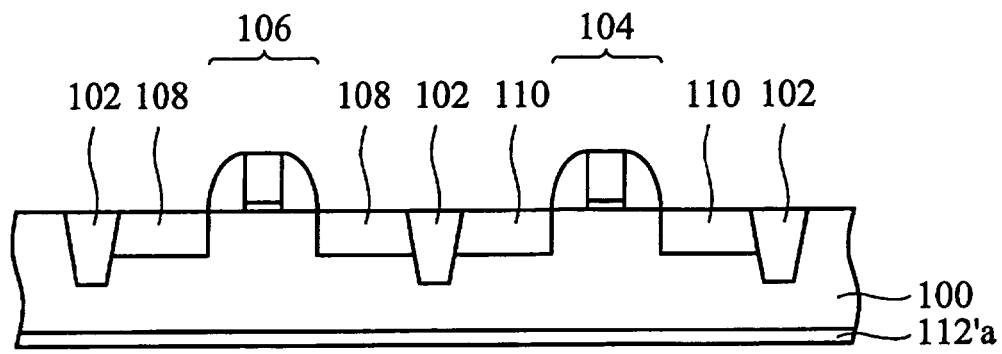
Figure 3D:
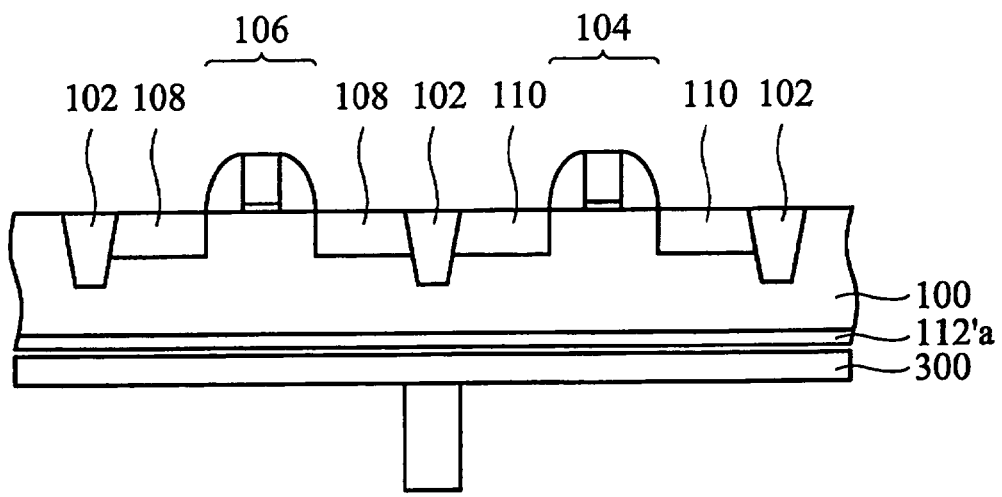

The semiconductor substrate 100 then passes through a phosphoric acid treatment (not shown), thus the silicon nitride layer 114 and the oxide layer 112 on the front side of the semiconductor substrate 100 are fully removed, however, a portion of the oxide layer 112'a on the rear side of the semiconductor substrate 100 remains, as shown in FIG. 3c. When the semiconductor substrate 100 is loaded onto an e-chuck stage 300, as shown in FIG. 3d, at an ionized ambient e.g. 0.1~3.0 GPa, the portion of the oxide layer 112'a can block the transfer of charge from the e-chuck stage 300. As a result, charge accumulation within the semiconductor substrate 100 can be eliminated due to the presence of the additional oxide layer 112' between the semiconductor substrate 100 and the e-chuck stage 300.

Fifth Embodiment

The method described in fourth embodiment, can be applied to the second embodiment. That is, an additional oxide layer (not shown) can be simultaneously formed on the rear side of the semiconductor substrate 100 at the step of forming the oxide layer 112 on the front side of the semiconductor substrate 100. Materials and formation of the additional oxide layer are the same as the oxide layer 112, and thus fabrication thereof is not described again. Thus, charge accumulation within the semiconductor substrate 100 can be prevented due to the presence the additional oxide layer between the semiconductor substrate 100 and the e-chuck stage.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of manufacturing a semiconductor device, comprising:
   providing a semiconductor substrate with at least a PMOS device and at least an NMOS device;
   forming conformally a first insulating layer overlying the NMOS and PMOS devices;
   forming conformally a second insulating layer overlying the first insulating layer;
   thinning the second insulating layer overlying the PMOS device to leave a remaining portion above the PMOS device, wherein the second insulating layer is remained above the NMOS device;
   performing a first thermal treatment on the NMOS and PMOS devices; and
   removing the second insulating layer overlying the NMOS device and the remaining portion of the second insulating layer overlying the PMOS device and thinning the first insulating layer overlying the NMOS and PMOS devices to leave a remaining portion on the NMOS and PMOS devices.

2. The method as claimed in claim 1, wherein the second insulating layer has a thickness greater than 200 angstroms.

3. The method as claimed in claim 1, wherein the second insulating layer has a thickness between 200 and 350 angstroms.

4. The method as claimed in claim 1, wherein the second insulating layer has a thickness between 200 and 500 angstroms.

5. The method as claimed in claim 1, wherein the remaining portion of the second insulating layer overlying the PMOS device has a thickness between 10 and 130 angstroms.

6. The method as claimed in claim 1, wherein the remaining portion of the second insulating layer overlying the PMOS device has a thickness between 20 and 100 angstroms.

7. The method as claimed in claim 1, further comprising: performing a second thermal treatment prior to the step of thinning the second insulating layer overlying the PMOS device.

8. The method as claimed in claim 1, wherein the step of thinning the second insulating layer overlying the PMOS device comprises:
    forming a patterned photoresist layer overlying the second insulating layer above the NMOS device;
    etching the second insulating layer overlying the PMOS device using the patterned photoresist layer as a mask until that the remaining portion of the second insulating layer overlying the PMOS device thinner than the second insulating layer overlying the NMOS device; and
    removing the patterned photoresist layer.

9. The method as claimed in claim 7, wherein the first or second thermal treatment is a rapid thermal annealing.

10. The method as claimed in claim 1, wherein the first insulating layer is an oxide layer.

11. The method as claimed in claim 1, wherein the formation of a first insulating layer comprises LPCVD.

12. The method as claimed in claim 1, wherein the second insulating layer is a nitride layer.

13. The method as claimed in claim 1, wherein the formation of a second insulating layer comprises LPCVD or PECVD.

14. The method as claimed in claim 1, wherein the first insulating layer has a thickness between 10 and 300 angstroms.

15. The method as claimed in claim 1, wherein the remaining portion of the first insulating layer overlying the NMOS and PMOS devices has a thickness between 30 and 60 angstroms.

16. A method of preventing charge accumulation, comprising:
    providing a semiconductor substrate including a front side and a rear side, wherein at least a PMOS device and at least an NMOS device are formed on the front side;
    forming simultaneously a first insulating layer conformally overlying the NMOS and PMOS devices and a second insulating layer overlying the rear side;
    forming conformally a third insulating layer overlying the first insulating layer;
    thinning the third insulating layer overlying the PMOS device to leave a remaining portion above the PMOS device, wherein the third insulating layer is remained above the NMOS device;
    performing a first thermal treatment on the NMOS and PMOS devices;
    removing the third insulating layer overlying the NMOS device and the remaining portion of the third insulating layer overlying the PMOS device and thinning the first insulating layer overlying the NMOS and PMOS devices to leave a remaining portion on the NMOS and PMOS devices; and
    loading the semiconductor substrate onto a wafer holder, wherein the second insulating layer is between the wafer holder and the semiconductor substrate.

* * * * *